US008677617B2

(12) United States Patent
Beaman

(10) Patent No.: US 8,677,617 B2
(45) Date of Patent: Mar. 25, 2014

(54) PRINTED CIRCUIT BOARD EDGE CONNECTOR

(75) Inventor: Brian Samuel Beaman, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 12/769,259

(22) Filed: Apr. 28, 2010

(65) Prior Publication Data

US 2011/0266042 A1   Nov. 3, 2011

(51) Int. Cl.
*H05K 3/40* (2006.01)

(52) U.S. Cl.
USPC ........... 29/846; 29/829; 29/847; 174/267; 174/261; 439/30; 439/29

(58) Field of Classification Search
USPC ......... 29/829, 830, 832, 852, 938, 831, 847, 29/848, 849, 854; 174/261, 75 F, 260, 264, 174/267; 257/93, 41, 44, 91, 145, 217; 439/166, 30, 29, 42, 52, 60, 72, 80, 81; 360/74.7, 74.6, 335.6, 236.4
See application file for complete search history.

(56) References Cited

U.S. PATENT DOCUMENTS

| | | | | |
|---|---|---|---|---|
| 4,843,190 A | * | 6/1989 | Verhoeven | 174/261 |
| 4,967,261 A | * | 10/1990 | Niki et al. | 257/735 |
| 5,040,997 A | | 8/1991 | Garner | |
| 5,273,439 A | * | 12/1993 | Szerlip et al. | 439/66 |
| 5,414,576 A | * | 5/1995 | Ueki et al. | 360/245.9 |
| 5,486,657 A | | 1/1996 | Bell et al. | |
| 6,410,857 B1 | * | 6/2002 | Gonya | 174/254 |
| 7,324,352 B2 | * | 1/2008 | Goodwin | 361/803 |
| 7,359,204 B1 | | 4/2008 | Jang et al. | |
| 7,547,213 B2 | | 6/2009 | Pax | |
| 7,596,863 B2 | | 10/2009 | Bhatt et al. | |
| 7,690,103 B2 | * | 4/2010 | Wang et al. | 29/830 |
| 2001/0014546 A1 | | 8/2001 | Yasufuku et al. | |
| 2003/0079907 A1 | * | 5/2003 | Eguchi et al. | 174/250 |
| 2006/0053345 A1 | * | 3/2006 | Goodwin | 714/42 |
| 2006/0213685 A1 | * | 9/2006 | Wang et al. | 174/258 |
| 2007/0270040 A1 | | 11/2007 | Jang et al. | |

FOREIGN PATENT DOCUMENTS

| | | |
|---|---|---|
| DE | 2029 235 | 12/1971 |
| JP | 03126289 | 5/1991 |
| JP | 10335020 A | 12/1998 |

OTHER PUBLICATIONS

PCT Search Report and Written Opinion, dated Apr. 26, 2011.
IBM Technical Disclosure Bulletin, v38, n11, Mar. 31, 2005, pp. 483-484 an inverted "v" design that not only has a beveled edge, but also has an inverted "v" cut along the face of the entire card. This allows the card to only have to overcome the connector pins on the outermost contacts first, then a pair of contacts on each side from then on until the card is fully inserted.

* cited by examiner

*Primary Examiner* — Peter DungBa Vo
*Assistant Examiner* — Kaying Kue
(74) *Attorney, Agent, or Firm* — Thomas E. Tyson; Steven L. Bennett

(57) ABSTRACT

A printed circuit board assembly and method of assembly is provided for a printed circuit board having a top and bottom surface with at least one edge portion having a rounded surface extending from the top surface to a point below the top surface and at least one electrical contact pad located on the top surface and extending over the edge portion rounded surface to a point below the top surface.

5 Claims, 8 Drawing Sheets

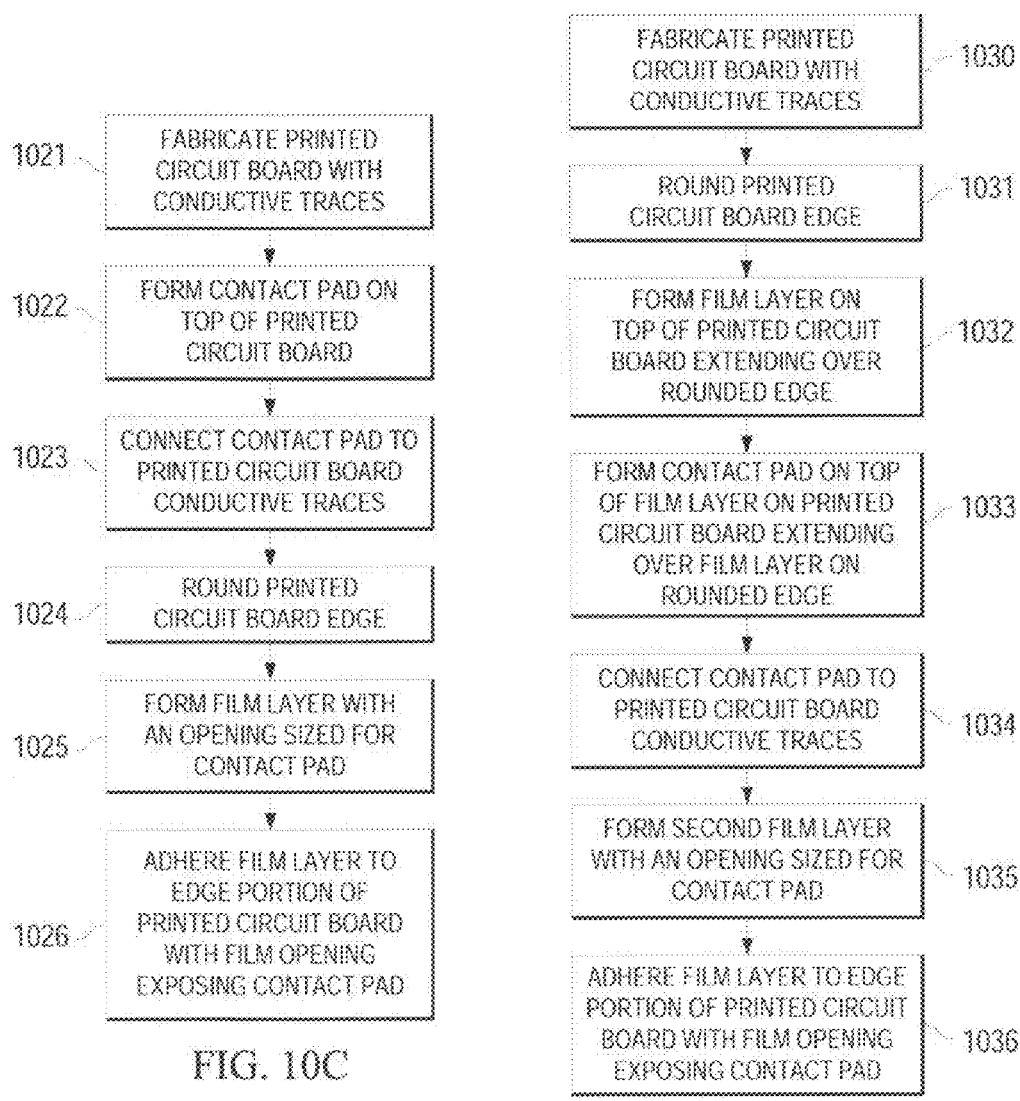

PRINTED CIRCUIT BOARD EDGE CONNECTOR

BACKGROUND OF THE INVENTION

1. Technical Field

The present invention relates to printed circuit board connectors. In particular, the present invention relates to printed circuit board edge connectors.

2. Description of the Related Art

Printed circuit (PC) cards or printed circuit boards (PCBs) have traditionally provided mechanical support for electronic components while providing electrical interconnections of these components. One means to connect a printed circuit board to other electronic circuitry is to provide a printed circuit board edge connection assembly using a series of contact pads fabricated and arranged in a row at the edge of the printed circuit board. These edge contact pads are electrically connected to the components upon the printed circuit board. Further, to connect the circuitry on a printed circuit board to other electronic system components, a printed circuit board socket connector is provided that receives a printed circuit board and its edge contact pads. This printed circuit board socket contains several metal contact springs positioned in the socket such that the insertion of the printed circuit board into the socket results in individual metal contact springs resting upon the surface of the printed circuit board and, specifically, contacting an individual one of the edge contact pads.

A typical prior art printed circuit board edge connection assembly is shown in part in FIG. 1A. In FIG. 1A, four contact spring connectors 104, 106, 108, and 110 are arranged to be placed upon four printed circuit board edge contact pads 112, 114, 116, and 118 which are upon the top surface 120 of the printed circuit board 100. Since the four contact spring connectors 104, 106, 108, and 110 are part of a printed circuit board edge connection socket (not shown) the contact spring connectors 104, 106, 108, and 110 are positioned when the printed circuit board 100 is inserted into the socket so that the contact spring connectors 104, 106, 108, and 110 rest on top of the printed circuit board edge contact pads 112, 114, 116, and 118 to form an electrical connection.

The contact spring connectors 104, 106, 108, and 110 and the printed circuit board edge contact pads 112, 114, 116, and 118 are typically plated with gold over nickel to minimize contact surface corrosion. One of the main problems with the contact edge connector assembly shown is the excessive wear of the contact spring connector bottom surface when mating the printed circuit board to the printed circuit card edge connector socket (not shown) containing the contact spring connector. Referring to FIG. 1B, a cross section view of FIG. 1A, as the printed circuit board 100 is inserted into the socket (not shown), the contact spring connector 110 first contacts the printed circuit board front edge 102 and, as the insertion continues, rides over the top of this edge 102 and then contacts the front edge of the printed circuit edge contact pad 118 upon the printed circuit board surface 120. Typically, the printed circuit board edge 102 of printed circuit board 100 is formed with a router bit resulting in a sharp edge having exposed glass fibers from the glassy epoxy laminate material of the printed circuit board. Continuing the insertion, the contact spring connector 110 rides over the edge of the contact pad 118 and onto the surface of the contact pad 118. During this insertion, the contact spring connector 110 has traveled over the printed circuit board edge 102 and then the contact pad 118 edge which can result in wearing of the contact spring connector surface plating. Many printed circuit board insertions will remove the gold and nickel plating leaving the contact spring connectors susceptible to corrosion which may cause reliability problems. In addition, other problems with the printed circuit board edge connection assembly of FIGS. 1A and 1B include the amount of force required to mate the printed circuit board with the printed circuit board socket, stubbing that may result in damage to the spring connector and misalignment of the spring connector during insertion that may result in shorting between across adjacent contact pads.

Alternate solutions to these problems are shown in FIGS. 2, 3, 4 and 5. In FIG. 2, a cross section view, a printed circuit board 200 includes a front edge 202 having chamfer edges 206 and 208. The chamfer edges 206 may reduce the edge scraping wear of a contact spring connector 210 as it engages the printed circuit board 200 and comes to rest upon the top of the contact pad 218. However this arrangement still results in wearing of the bottom surface of the contact spring connector 210 with little to no effect on the insertion force required.

FIG. 3 is another embodiment shown in cross section illustrating a printed circuit board 300 having a TEFLON (a trademark of DuPont) edge 302 which provides an inclined surface 306 to receive the contact spring connector 310 to reduce the printed circuit board edge connection insertion force and reduce wear on the spring contact connector 310. However, the addition of the Teflon cap 302 increases the complexity of the printed circuit board assembly resulting in an increase in manufacturing cost.

A further embodiment shown in cross section in FIG. 4 illustrates a printed circuit board 400 having a rounded front edge 402 with a surface coating of epoxy. Surface 406 is the first contact point for the contact spring connector 410 as the printed circuit board 400 is inserted. The use of the epoxy coating on the printed circuit board edge 402 reduces the insertion force required to assemble the printed circuit board into the printed circuit board edge connector socket and reduces wear on the contact spring connectors. However, the step of adding the epoxy coating exposes the contact pads, such as contact pad 418, to contamination and this step also adds complexity to the printed circuit board assembly resulting in increased manufacturing costs.

Another embodiment is illustrated in FIG. 5 which is a cross section view of a printed circuit board 500 including a continuous flex circuit film 504 completely covering a thermally conductive stiffener which is typically a metal plate. A contact pad 502 is fabricated on the surface of the flexible circuit film 504. As the printed circuit board 500 is inserted into a printed circuit board edge connector socket (not shown) a contact spring connector 510 will first encounter the flex circuit film before it contacts the edge contact pad 502 riding up on the contact pad 502 edge indicated as 506. It should be understood for this embodiment, the flexible circuit film covers the entire printed circuit board. As such, only the flexible film surface is available for the mounting of electrical components electronic components and wiring. In other words, it is a two layer printed circuit board assembly. However the continuous flexible circuit film does reduce the insertion force required to mat the printed circuit board with a printed circuit board edge connector socket and reduces wear on the contact spring connectors during the insertion process. Providing a continuous flexible circuit film bonding onto a conductive stiffener increases the cost of the printed circuit board manufacture and decreases the versatility of the printed circuit board assembly since only two layers are available for all electronic component wiring.

SUMMARY

In accordance with the present invention, a printed circuit board assembly is provided that include top and bottom surfaces and having at least one edge portion with a rounded surface extending from the top surface to a point below the top surface and at least one electrical contact pad located on the top surface extending over the top surface onto the rounded surface of the edge portion to a point below the top surface.

In addition, a method is provided for manufacturing a printed circuit board including the steps of covering an edge portion of the printed circuit board to form a rounded surface edge and fabricating contact pads upon the top of the printed circuit board which extend over the rounded edge portion of the printed circuit board.

BRIEF DESCRIPTION OF THE DRAWINGS

The present invention may be better understood, and its numerous objects, features, and advantages made apparent to those skilled in the art by referencing the accompanying drawings.

FIG. 10C is a flowchart illustrating the manufacturing process for the printed circuit board assembly of FIGS. 8A and 8B; and FIG. 10D is a flowchart illustrating the manufacturing process for the printed circuit board assembly of FIGS. 9A and 9B.

DETAILED DESCRIPTION

The following is intended to provide a detailed description of examples of the invention and should not be taken to be limiting of the invention itself. Rather, any number of variations may fall within the scope of the invention, which is defined in the claims following the description.

The present invention is a printed circuit board edge connector assembly that reduces the insertion force required to insert a printed circuit board into a printed circuit board edge connection socket assembly while reducing wear upon contact surfaces of contact spring connectors within the printed circuit board edge connection socket. Also provided is a method for producing the printed circuit board edge connector assembly.

In the figures only a single row of printed circuit board edge contact pads on top of a printed circuit board is shown. However, as typical for many printed circuit boards, contact pads can be formed on both the top and bottom surfaces of the printed circuit board and the top and bottom contact pads mate respectively with top and bottom spring connectors in a printed circuit board edge connector socket.

Figure 1A:
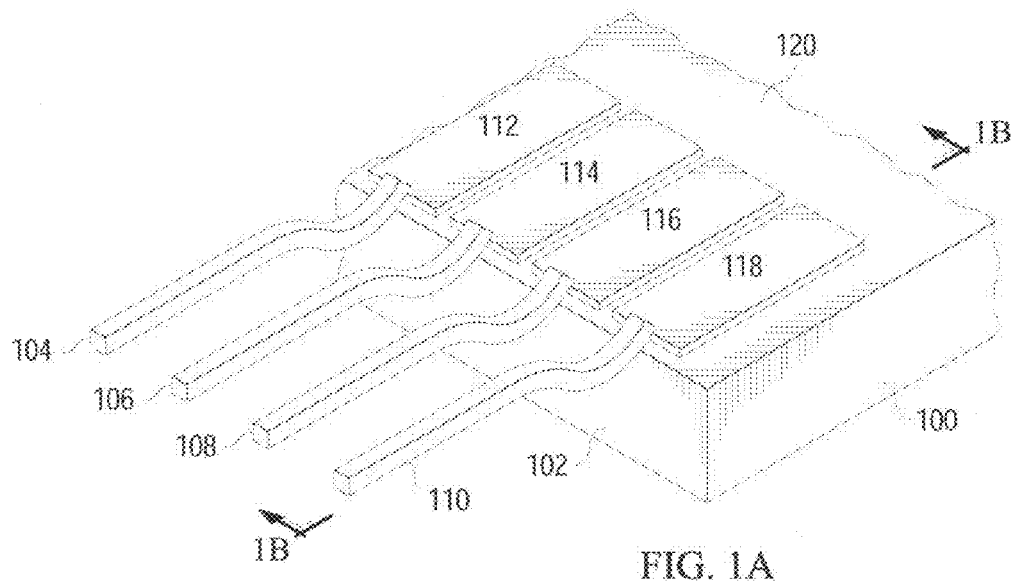
FIG. 1A is an isometric view of an edge portion of a printed circuit board assembly including several contact pads and corresponding contact spring connectors.
Figure 1B:
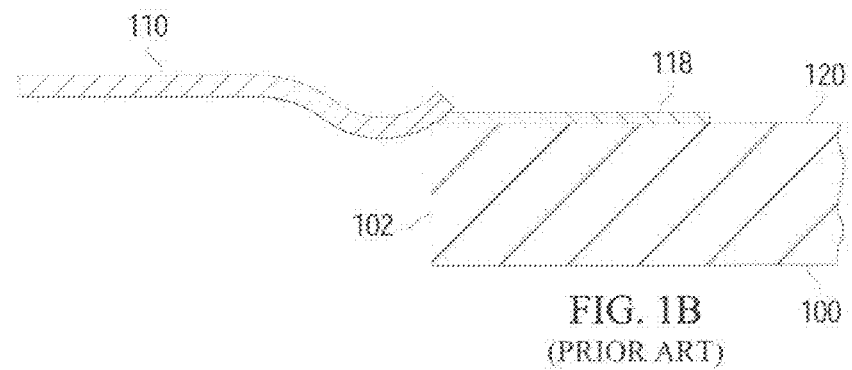
FIG. 1B is a cross section view of the printed circuit board assembly of FIG. 1A.
Figure 2:
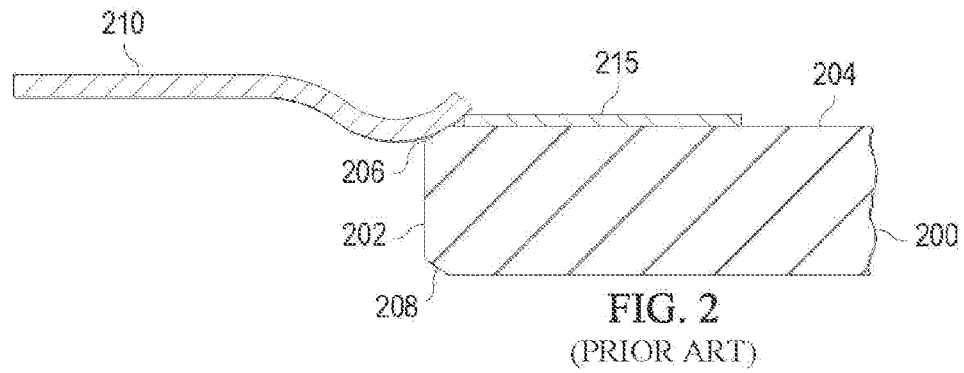
FIG. 2 is a cross section view of an edge portion of a printed circuit board assembly having chamfer edges.
Figure 3:
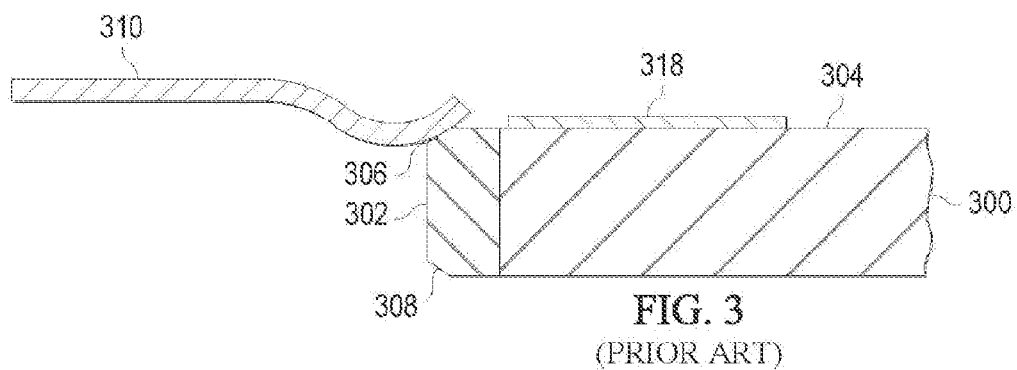
FIG. 3 is a cross section view of an edge portion of a printed circuit board assembly having a Teflon cap on the edge portion.
Figure 4:
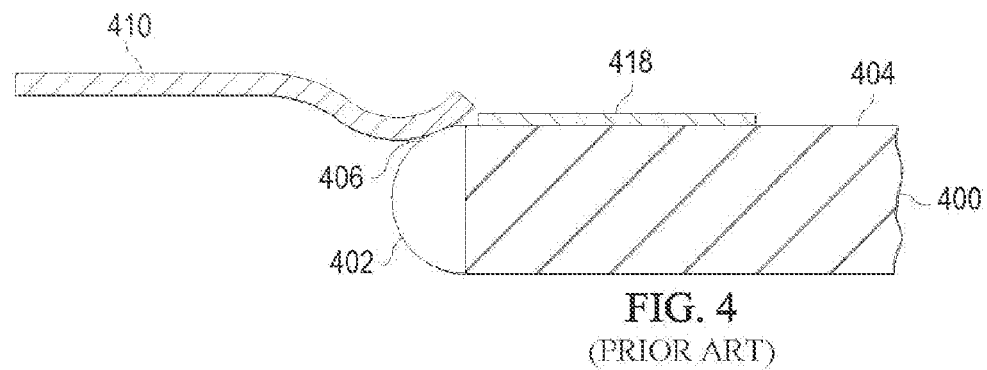
FIG. 4 is a cross section view of an edge portion of a printed circuit board assembly having an epoxy coated edge.
Figure 5:
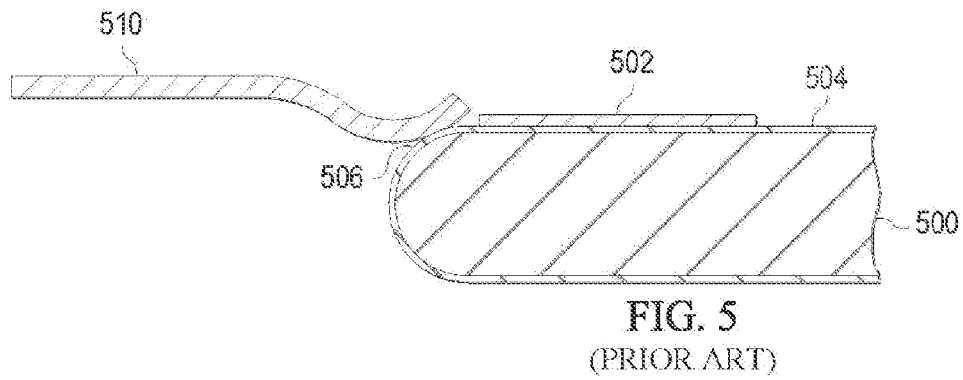
FIG. 5 is a cross section view of an edge portion of a printed circuit board assembly having a continuous flexible circuit film bonded about a conductive stiffener.
Figure 6A:
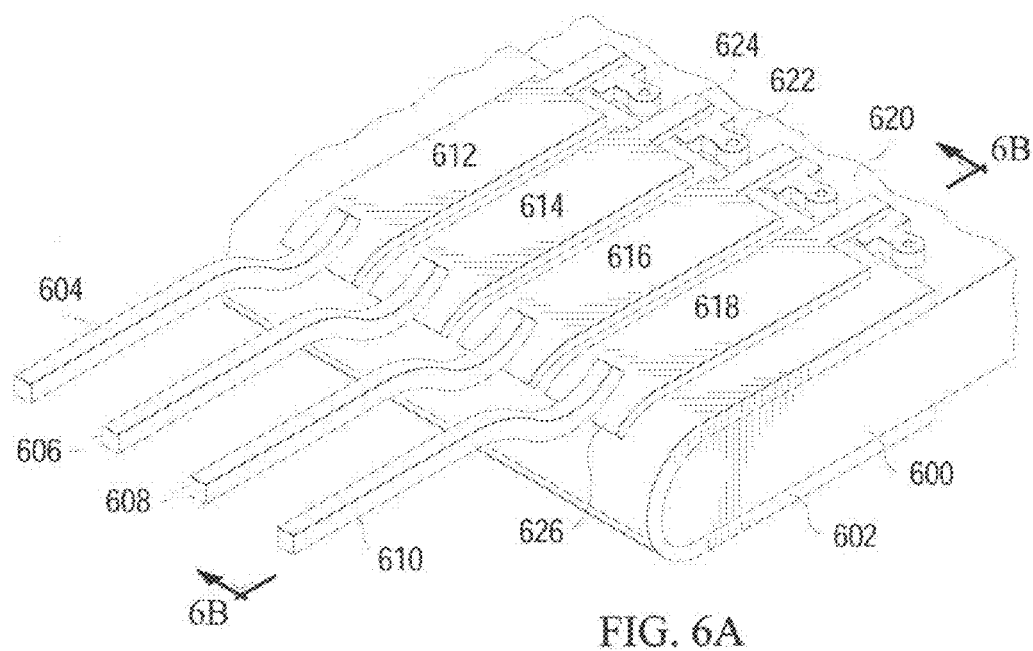
FIG. 6A is an isometric view of a first embodiment of the present invention including an edge portion of a printed circuit board assembly having contact pads fabricated on a flexible circuit film cover extending over the edge of the printed circuit board assembly.

FIG. 6A is an isometric view of an edge portion of a printed circuit board 600 having a rounded edge that includes a flexible circuit film 602 bonded thereupon. The flexible circuit film 602 covers only a front edge portion of the printed circuit board 600. Therefore, the printed circuit board portion surface 620 is exposed and includes printed circuit board contacts such as 622 mounted upon the printed circuit board surface 620 and which are interconnected to wiring and components of the printed circuit board (not shown). In other words, the printed circuit board 600 is otherwise as typical multilayer circuit board that can include a number of wiring layers in excess of two. Fabricated on the flexible circuit film 602 is a series of edge contact pads 612, 614, 616, and 618. Each of these contact pads include a tab (shown for contact pad 618 as tab 624) which extends over the printed circuit board contact 622 to be soldered to the printed circuit board contact 622 enabling the contact pad 618 to be electrically connected to other wiring traces within the printed circuit board 600 and any electrical components mounted thereon. The contact pads 612, 614, 616 and 618 are fabricated upon the flexible circuit film 602 in a manner that extends the contact pad surface on the top surface of the printed circuit board 620 over the edge portion such that the front part of the contact pad 618 (shown as 626) is positioned below the top surface of the printed circuit board 600. When the printed circuit board 600 is inserted into a printed circuit board edge connection socket (not shown) containing a series of contact spring connectors, shown as 604, 606, 608, and 610, the first point of contact of the contact spring connectors with the printed circuit board 600 will be the contact pads.

Figure 6B:
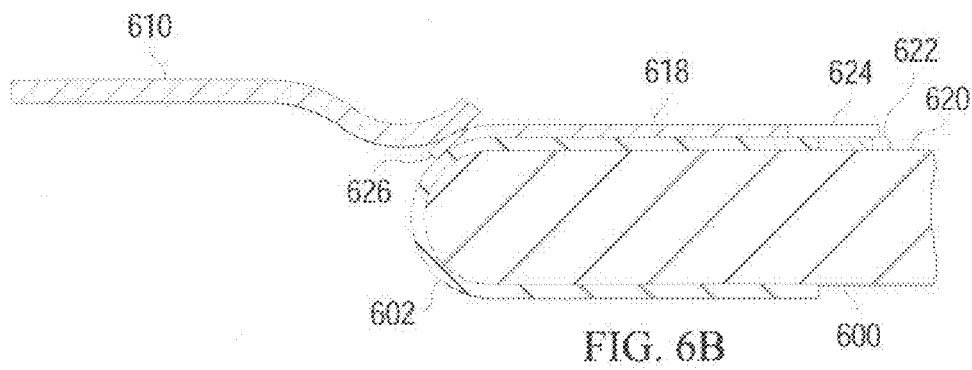
FIG. 6B is a cross section view of the printed circuit board assembly of FIG. 6A.

This is illustrated in FIG. 6B (which is a cross section view of the assembly of FIG. 6A). In FIG. 6B, the contact spring connector 610 first makes contact with a front portion 626 of the contact pad 618. Since both the contact spring connector 610 and the contact pad 618 are gold and nickel plated, any wear on the contact spring connector 610 surface will be minimized when the printed circuit board is inserted into the printed circuit board edge connection socket.

Figure 7A:
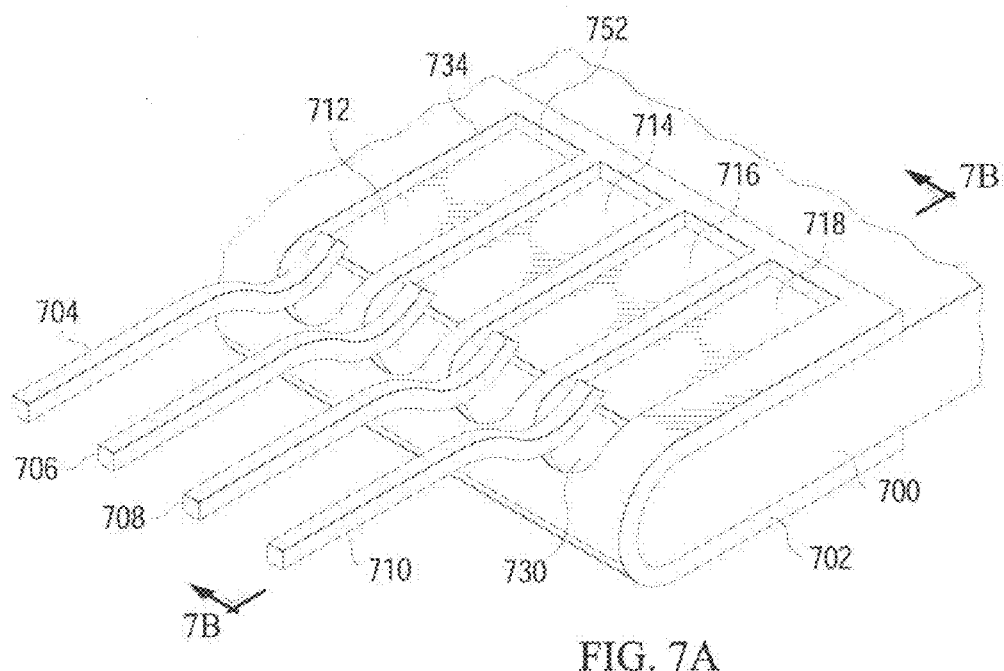
FIG. 7A is an isometric view of a second embodiment of the invention including an edge portion of a printed circuit board assembly with a partial flexible circuit film covering containing openings for contact pads fabricated upon the printed circuit board surface.
Figure 7B:
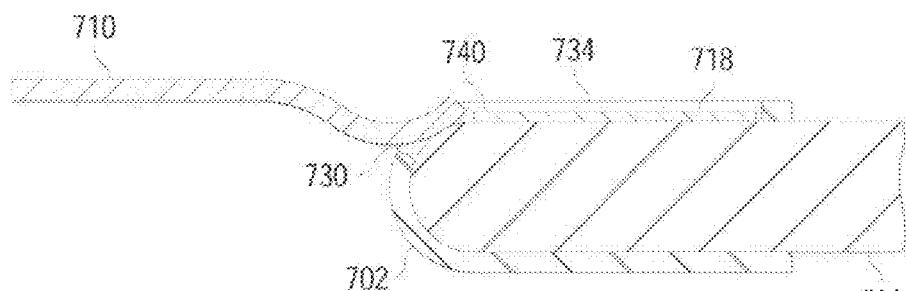
FIG. 7B is a cross section view of the printed circuit board assembly of FIG. 7A.

FIG. 7A illustrates a second embodiment of the present invention. FIG. 7A is an isometric view illustrating an edge portion of a printed circuit board 700 containing contact pads 712, 714, 716 and 718 fabricated on the surface of the printed circuit board 700. These contact pads 712, 714, 716, and 718 may form electrical connections to other wiring layers within the printed circuit board 700 in a traditional manner. A flexible film 702 is sized and fabricated to cover a front edge portion of the printed circuit board 700 such that the film 702 includes openings exposing the contact pads 712, 714, 716 and 718. In reference to contact pad 718, the opening 732 in the film 702 includes a front portion in front of the contact pad 718 that exposes a rounded edge portion 730 of the printed circuit board 700. The opening 732 also exposes the contact pad 718 so that when the printed circuit board is inserted into a printed circuit board edge connection socket, the contact spring connectors 704, 706, 708 and 710 will first encounter the rounded edge of the printed circuit board 700 and then ride onto the contacts pads 712, 714, 716 and 718. The openings, such as 730 for the contact spring connector 710, provides a guide channel for the contact spring connector 710 as it travels to rest upon the surface of the contact pad 718. For example, a wall 734 formed by the flexible circuit film 702 prevents the contact spring connector 710 from laterally deviating from the surface of the contact pad 718. This is also shown in a cross-sectional view in FIG. 7B illustrating how the contact spring connector 710 enters the opening 730 in front of the connection pad 718 and, as the insertion continues, travels on top of the front edge portion 740 of the contact 718 while being laterally restrained by the flexible circuit film wall 734.

Figure 8A:
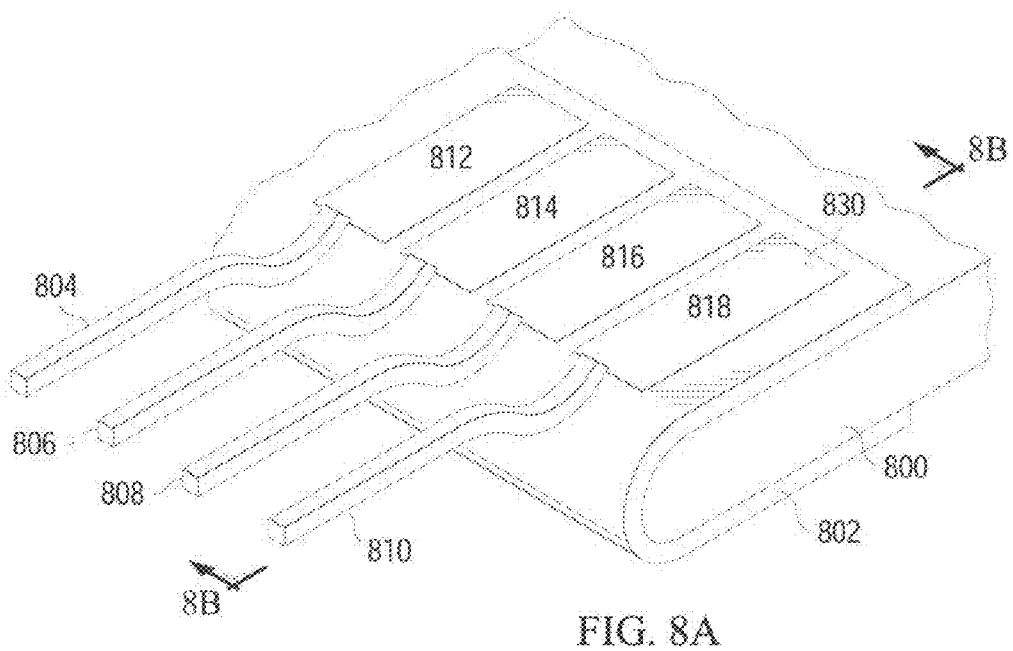
FIG. 8A is an isometric view of a third embodiment of the invention illustrating an edge portion of a printed circuit board assembly with a flexible circuit film covering containing openings sized for the contact pads fabricated upon the printed circuit board surface.
Figure 8B:
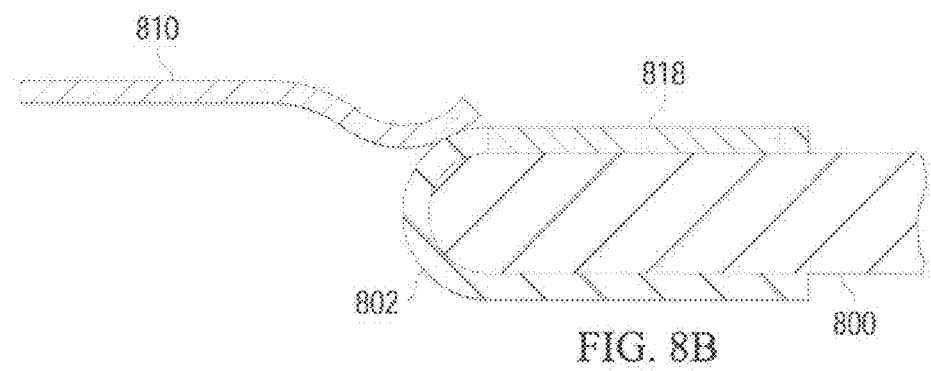
FIG. 8B is a cross section view of the printed circuit board assembly of FIG. 8A.

FIG. 8A is a third embodiment of the invention similar to the embodiment shown in FIG. 7A. In FIG. 8A, four contact pads 812, 814, 816 and 818 are fabricated on the surface of a printed circuit card 800. A flexible film 802 partially covers the edge portion of the printed circuit card 800 as shown. The flexible film 802 includes several openings which expose the edge contact pads 812, 814, 816, and 818 when the flexible film 802 is bonded to the surface of the printed circuit board 800. One flexible film opening 830 is shown to expose edge contact pad 818. Four contact spring connectors 804, 806, 808 and 810 are shown to be positioned such that when the printed circuit board 800 is inserted into a printed circuit board edge connector socket (not shown) these contact spring connectors 804, 806, 808, and 810 do not make contact with the top surface of the printed circuit board 800 but make first contact with the flexible film 802 as they travel to rest upon the top of the edge contact pads 812, 814, 816 and 818. This is shown in FIG. 8B which is a cross-sectional view of the assembly in FIG. 8A. Referring to FIG. 8B, the contact spring connector 810 first makes contact with the flexible film 802 when the printed circuit card board 800 is being inserted in the printed circuit board edge connector socket. The flexible film 802 causes the contact spring connector 810 to rise above the printed circuit board rounded edge and come to rest upon contact pad 818 as the printed circuit board 800 is being inserted. Since the flexible film is much less abrasive than the printed circuit board surface, this assembly minimizes wear of the contact spring connector 810 bottom surface.

Figure 9A:
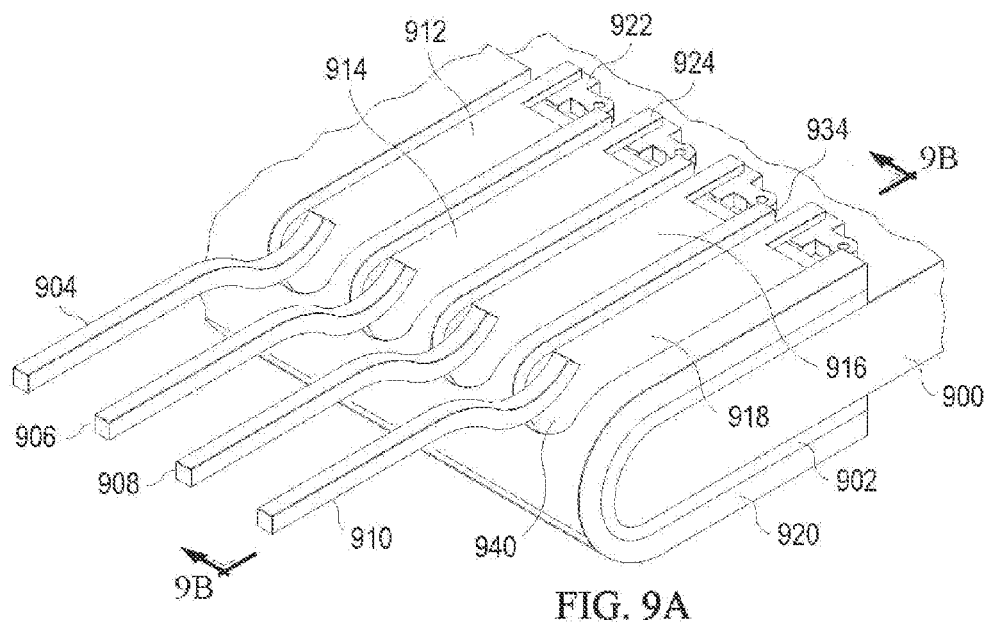
FIG. 9A is an isometric view of a fourth embodiment of the invention including an edge portion of a printed circuit board assembly including two partial flexible circuit film coverings.
Figure 9B:
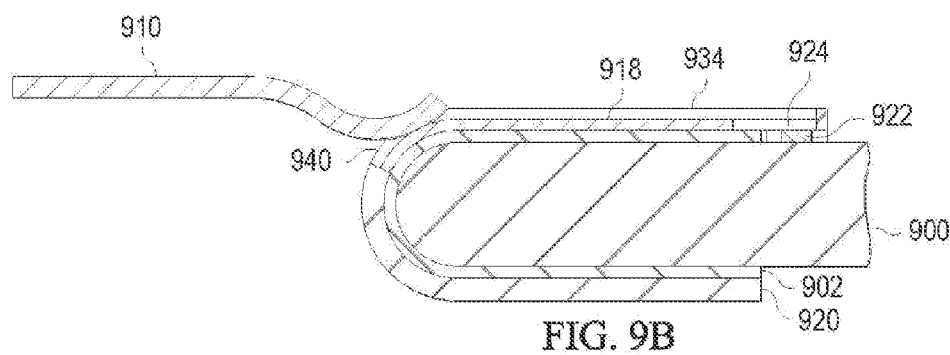
FIG. 9B is a cross section view of the printed circuit board assembly of FIG. 9A.

A fourth embodiment of the present invention is illustrated in FIG. 9A. In this embodiment, a printed circuit board 900 includes a rounded edge portion that is partially covered by a first flexible circuit film 902. Four edge contact pads 912, 914, 916, 918 are formed on top of this flexible circuit film 902. These edge connector pads include a tab, such as 924 for edge contact pad 918 that is soldered to a printed circuit board contact 922 fabricated on the surface of printed circuit board 900. This connection of the tab 924 to the contact 922 electrically connects the edge connector pad 918 to other wiring of the printed circuit card 900. Edge contact pads 912, 914, 916, and 918 include portions that extend over the edge of the current circuit board 900 conforming to the rounded edge surface on top of the flexible circuit film 902. A second flexible film 920 is placed on top of the first flexible circuit film 902. The second flexible film 920 includes openings such a shown such as 924 shown for edge contact pad 918 which expose the edge contact pads while providing a guiding and channeling structure including a wall 934. Contact spring connectors 904, 906, 908 and 910 are positioned in FIG. 9A to electrically contact edge connector contact pads 912, 914, 916 and 918 respectively. A cross-section view of the assembly of FIG. 9A is shown in FIG. 9B. When the printed circuit board 900 is inserted into a printed circuit board edge connector socket (not shown) the contact spring connector 910 will make first contact with this printed circuit board assembly 900 (as shown in FIG. 9B) by first contacting the edge contact pad 918 through an opening 940 of the second flexible film 920. Additionally a wall 934 provided by the second flexible film 920 will guide the contact spring connector 910 as the printed circuit card 900 is inserted.

FIGS. 10A, 10B, 10C and 10D illustrate flowcharts for the manufacturing process for the printed circuit board assemblies of FIGS. 6A, 7A, 8A and 9A respectively.

Figures 10A, 10B:
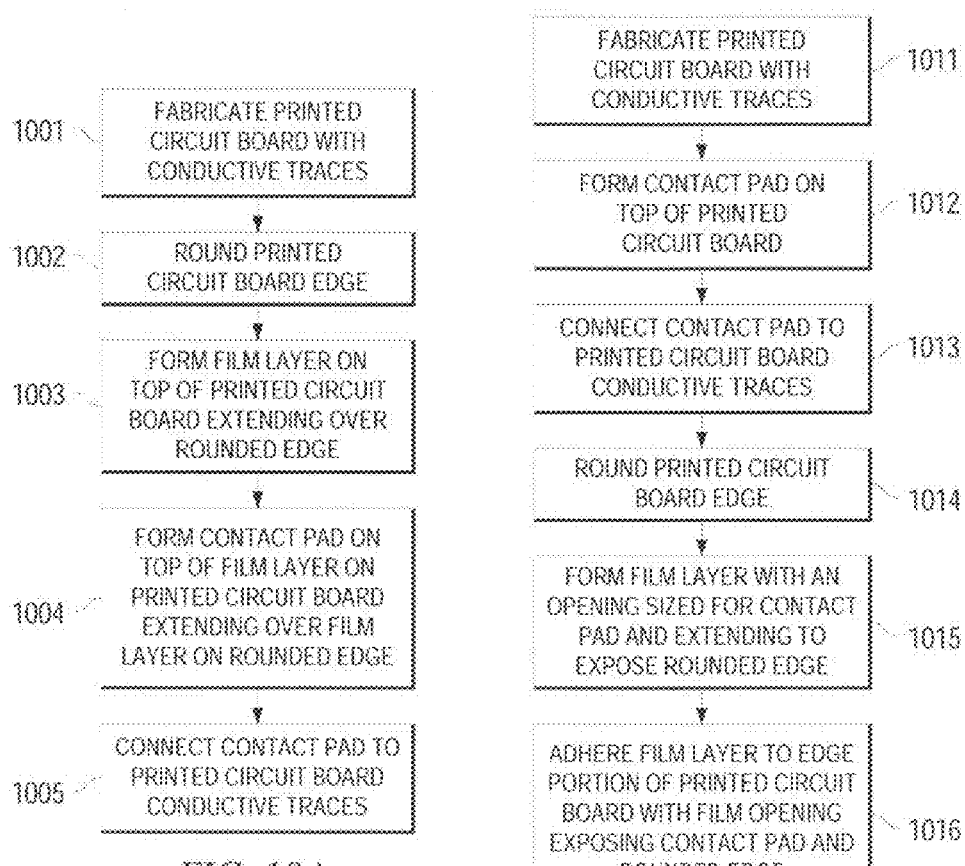
FIG. 10A is a flowchart illustrating the manufacturing process for the printed circuit board assembly of FIGS. 6A and 6B.
FIG. 10B is a flowchart illustrating the manufacturing process for the printed circuit board assembly of FIGS. 7A and 7B.

For manufacturing the printed circuit board connectors shown in FIGS. 6A and 6B, FIG. 10A illustrates the process beginning with the fabrication of the printed circuit board in step 1001. The printed circuit board edge portion is radiused or rounded in step 1002 which can be formed with a router or equivalent shaping tool. For step 1003, the flex circuit is typically fabricated using a 1 or 2 mil thick layer of polyimide or KAPTON material in a flat sheet form. In step 1004, the copper circuitry is formed using typical photo lithographic techniques starting with a copper foil that is adhesively laminated or plated up on the surface of the polyimide sheet. The photo lithographic processes are used to expose the resist and etch away the excess copper material to form the contact pads. The tab 624 that is cantilevered over the edge of the polyimide film requires processing techniques that are common with tape automated bonding technology. The section of the polyimide film that is located under the cantilevered tab 624 is removed and replaced with a temporary filler material that can be selectively removed after the copper circuitry is patterned on the top surface of the polyimide film. The section of polyimide film can be removed using a mechanical punch and die or other techniques including laser or chemical etching. The temporary filler material is used to fill the section of the polyimide film that was removed and provides a smooth surface for the copper circuitry to be patterned. The filler material can be selectively removed without damaging the copper circuitry that is patterned on the surface of the polyimide sheet. After the copper circuitry pattern is formed on the polyimide film, the contact pads are plated with a layer of nickel and overplated with gold to provide a reliable contact interface for the card edge connector.

Multiple sections of contact pads are typically formed on a single polyimide sheet. After the copper circuitry is formed and the contact pads have been plated, the sections of contact pads are cut to fit the edge of the circuit card and formed and adhesively bonded to the edge of the card. Special attention is required during the forming operation to prevent damage to the contact pads and to prevent delamination of curved portion of the pads from the polyimide sheet. In step 1005, attention is also required to ensure precise alignment of the cantilevered contact tab extensions with the solder pads 622 on the circuit card. Typical solder reflow assembly processes are used to form the soldered connections between the cantilevered tabs on the flex circuit 624 and the pads 622 on the circuit card.

FIG. 10B illustrates the process for fabricating the printed circuit board edge connectors of FIGS. 7A and 7B. In step 1011, the printed circuit board is fabricated followed by the step 1012 where the contact pads are formed upon the printed circuit board by typical photo lithographic techniques and step 1013 connected to appropriate printed circuit board conductive traces. The printed circuit board edge is then rounded similar to step 1002 in FIG. 10A. In step 1015, the flex film is fabricated from the same polyimide sheet used in the flex circuit described for FIGS. 6A and 6B. However, an increased thickness of the material is needed. The exact thickness of the material depends on the thickness of the contact pads on the circuit card. It is desirable for the thickness of the flex film to be 2-3 mils thicker than the thickness of the contact pads. The flex film fabrication techniques include creating the openings in the sheet of polyimide and a sizing operation to cut the sections of flex film to fit the circuit card edge. The openings in the sheet of polyimide material can be formed by a mechanical punch and die tool or using a laser or chemical etching process. The sections of flex film are formed. In step 1016, the flex film is adhesively bonded to the edge of the circuit card. Special attention is required to ensure precise alignment of the openings in the flex film with the contact pads on the circuit card edge. Special attention is also required to prevent the adhesive on the flex film from contaminating the surface of the contact pads on the circuit card.

In FIG. 10C, the method of fabricating printed circuit board edge connectors FIG. 8A, and 8B include techniques that are the same in FIG. 10B. In other words, steps 1021, 1022, 1023 and 1024 are the same as steps 1011, 1012, 1013, and 1014 respectively of FIG. 10B. However, for step 1025, the thickness of the polyimide sheet is matched to the thickness of the contact pads on the circuit card. Also, the geometry of the openings in the flex film are made to match the geometry of the contact pads on the circuit card. Lastly, step 1026 is the same as step 1016 in FIG. 10B.

The fabrication techniques for this embodiment of FIGS. 9A and 9B combine the fabrication techniques for the flex circuit used in FIGS. 6A and 6B along with fabrication techniques used for the flex film in FIGS. 7A and 7B. Specifically for FIG. 10D, steps 1030, 1031, 1032, 1033, and 1034 are the same as steps 1001, 1002, 1003, 1004, and 1005 respectively for FIG. 10A. For steps 1035 and 1036, the second flex film, similar to the one shown in FIGS. 7A and 7B, is formed and adhesively bonded to the surface of the first flex circuit.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

The invention claimed is:

1. A method of fabricating a printed circuit board with an edge connector comprising the steps of:
    fabricating a printed circuit board having at least one electrically conductive path on a top surface of the printed circuit board,
    fabricating a rounded edge of the printed circuit board,
    forming an edge connector contact pad upon the top surface portion of the printed circuit board and electrically connecting the contact pad to the at least one conductive path, and
    forming a layer over a portion of the printed circuit board top surface and extending the layer over the rounded edge to a bottom surface portion of the printed circuit board and providing an opening in the layer to expose the edge connector contact pad and further including the step of providing the first layer opening in front of the contact pad to expose a portion of the rounded edge of the printed circuit board located adjacent to the edge connector contact pad.

2. A method of fabricating a printed circuit board with an edge connector comprising the steps of:
    fabricating a printed circuit board having at least one electrically conductive path on a top surface of the printed circuit board, the printed circuit board having a thickness and a thickness midpoint at one half of the thickness,
    fabricating a rounded edge of the printed circuit board,
    forming a first layer film over a portion of a top surface portion of the printed circuit board and extending over the rounded edge to a bottom surface portion of the printed circuit board,
    forming a first edge connector contact pad upon a top surface portion of the first layer and extending over the first layer covering the rounded edge to a point below the top surface of the printed circuit board and ending above the thickness midpoint,
    electrically connecting the first edge connector contact pad to the at least one conductive path,
    forming a second layer film on top of the first film layer and with a first opening exposing the first edge connector contact pad and forming a first wall surrounding the first edge connector contact pad.

3. A method of fabricating a printed circuit board according to claim 2 further including the step of forming a second edge connector located in parallel adjacency to the first edge connector and wherein the step of forming the second layer film includes the step of forming a second opening exposing the second edge connector and forming a second wall surrounding the second edge connector.

4. A method of fabricating a printed circuit board according to claim 1 wherein the layer formed over the portion of the printed circuit board top surface includes a flexible polyimide film.

5. A method of fabricating a printed circuit board according to claim 2 wherein the layer formed over the portion of the printed circuit board top surface includes a flexible polyimide film.

* * * * *